(12) United States Patent
Heinrich et al.

(10) Patent No.: US 8,048,726 B2
(45) Date of Patent: Nov. 1, 2011

(54) SOI SEMICONDUCTOR DEVICE WITH REDUCED TOPOGRAPHY ABOVE A SUBSTRATE WINDOW AREA

(75) Inventors: Jens Heinrich, Wachau (DE); Kai Frohberg, Niederau (DE); Sven Mueller, Wiednitz (DE); Kerstin Ruttloff, Hainichen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/914,663

(22) Filed: Oct. 28, 2010

(65) Prior Publication Data

US 2011/0189825 A1 Aug. 4, 2011

(30) Foreign Application Priority Data

Jan. 29, 2010 (DE) .................. 10 2010 001 400

(51) Int. Cl.
H01L 21/00 (2006.01)
H01L 21/84 (2006.01)
H01L 21/302 (2006.01)
H01L 21/461 (2006.01)

(52) U.S. Cl. .............. 438/151; 438/691; 438/756

(58) Field of Classification Search ............ 438/151, 438/691, 756
See application file for complete search history.

(56) References Cited

U.S. PATENT DOCUMENTS

| | | | |
|---|---|---|---|
| 6,716,679 B2 * | 4/2004 | Bae | 438/132 |
| 2001/0023097 A1 * | 9/2001 | Huang | 438/238 |
| 2008/0268585 A1 * | 10/2008 | Gehring et al. | 438/152 |
| 2009/0194842 A1 | 8/2009 | Ohara | 257/506 |

FOREIGN PATENT DOCUMENTS

| | | |
|---|---|---|
| DE | 102006041006 A1 | 3/2008 |
| DE | 102007004859 A1 | 8/2008 |
| DE | 102007057688 A1 | 6/2009 |
| DE | 112007001725 T5 | 6/2009 |
| DE | 102008007002 A1 | 8/2009 |

OTHER PUBLICATIONS

Translation of Official Communication from German Patent Office for German Patent Application No. 10 2010 001 400.1-33 dated Oct. 18, 2010.

* cited by examiner

Primary Examiner — William M. Brewster
(74) Attorney, Agent, or Firm — Williams, Morgan & Amerson, P.C.

(57) ABSTRACT

In sophisticated SOI devices, circuit elements, such as substrate diodes, may be formed in the crystalline substrate material on the basis of a substrate window, wherein the pronounced surface topography may be compensated for or at least reduced by performing additional planarization processes, such as the deposition of a planarization material, and a subsequent etch process when forming the contact level of the semiconductor device.

21 Claims, 9 Drawing Sheets

SOI SEMICONDUCTOR DEVICE WITH REDUCED TOPOGRAPHY ABOVE A SUBSTRATE WINDOW AREA

BACKGROUND OF THE INVENTION

1. Field of the Invention

Generally, the present disclosure relates to integrated circuits, and, more particularly, to SOI semiconductor devices comprising semiconductor elements, such as substrate diodes, that are formed in the crystalline material of the substrate.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Therefore, reducing the feature sizes and, in particular, the gate length of the field effect transistors has been an important design criterion.

In view of further enhancing performance of transistors, in addition to other advantages, the SOI (semiconductor- or silicon-on-insulator) architecture has been continuously gaining in importance for manufacturing MOS transistors due to their characteristics of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. This configuration provides significant advantages, but also gives rise to a plurality of issues.

For example, semiconductor elements, such as diodes and the like, may have to be implemented in the substrate material due to certain device requirements, thereby necessitating the formation of appropriate areas in which the substrate material has to be exposed. Any such area may be referred to as a substrate window and may affect the further processing due to a pronounced surface topography. For example, one important issue in high performance devices, such as microprocessors and the like, is an efficient device internal temperature management due to the significant heat generation of the transistors. Due to the reduced heat dissipation capability of SOI devices caused by the buried insulating layer, the corresponding sensing of the momentary temperature in SOI devices is of particular importance. Typically, for thermal sensing applications, an appropriate diode structure may be used wherein the characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may, therefore, typically be desirable to provide a substantially "ideal" diode characteristic in order to allow a precise estimation of the temperature conditions within the semiconductor device. In SOI devices, a corresponding diode structure, i.e., the respective PN junction, is frequently formed in a substrate window area, i.e., in the substrate material located below the buried insulating layer, above which is formed the "active" semiconductor layer used for forming therein the transistor elements. Thus, at least some additional process steps may be required, for instance, for etching through the semiconductor layer or a corresponding trench isolation area and through the buried insulating layer in order to expose the crystalline substrate material. On the other hand, the process flow for forming the substrate diode is typically designed so as to exhibit a high degree of compatibility with the process sequence for forming the actual circuit elements, such as the transistor structures.

Although providing substrate diodes in sophisticated SOI semiconductor devices is a promising approach for obtaining reliable temperature data during the operation of the semiconductor device, conventional approaches for forming substrate diodes may result in significant yield losses and, thus, loss of performance in the corresponding substrate window due to the continuous shrinkage of device features, such as transistors, lines and the like. For example, in sophisticated semiconductor devices comprising field effect transistors, the gate length has reached values of approximately 40 nm and less, thereby increasing packing density and also providing superior performance of the individual transistors. Similarly, the wiring network, i.e., the metallization system in combination with an appropriate contact level, has to be appropriately adapted to the increased packing density in the device level of sophisticated semiconductor devices, thereby also requiring contact elements and metal features of reduced lateral dimensions. At the same time, the thickness or height of the various metallization levels may have to be reduced so as to correspond to the reduced lateral dimensions. During the fabrication of contact levels, i.e., the dielectric material and the corresponding contact elements formed therein that connect to the contact areas of the semiconductor-based circuit elements, and during the fabrication of the metallization layers of the complex metallization system, a plurality of very complex processes, such as lithography processes, deposition and patterning processes, have to be applied, which may be very sensitive to the overall surface topography of the semiconductor device at a specific manufacturing stage under consideration. In particular, any material removal processes based on a polishing process have been identified to cause significant irregularities when forming contact elements and metallization layers, as will be described in more detail with reference to FIG. 1.

FIG. 1 schematically illustrates a cross-sectional view of a semiconductor device 100, which represents an SOI device, since the device 100 comprises a substrate 101, a buried insulating layer 103 and a silicon-based semiconductor layer 104. The substrate 101 may represent a silicon substrate and, thus, comprises a crystalline substrate material 102, above which is formed the buried insulating layer 103, which is typically comprised of silicon dioxide. As illustrated, in a certain device area 110A the buried insulating material 103 and the semiconductor layer 104 are at least partially removed in order to provide any circuit elements in the device area 110A within the crystalline substrate material 102. As previously indicated, the device area 110A may also be referred to as a substrate window and is frequently used for implementing a plurality of substrate diodes 150 in and above the crystalline substrate material 202 within the device area 110A. On the other hand, a device area 110B comprises the semiconductor layer 104, in and above which circuit elements are formed, such as sophisticated transistors and the like, wherein, for convenience, a single transistor element 160 is illustrated in FIG. 1.

As discussed above, in sophisticated applications, the transistor 160 may comprise a gate electrode structure 161 having a gate length of approximately 40 nm and less. Furthermore, the transistor 160 comprises drain and source regions 162, wherein at least deeper areas thereof have substantially the same configuration, i.e., dopant concentration, as highly doped regions 152 of the substrate diode 150, wherein, however, the doped regions 152 are formed within an appropriately doped well region 102W provided in the crystalline substrate material 102 within the device area 110A. Similarly, the substrate diodes 150 may further comprise highly doped areas 153, which have a similar configuration as any drain and source regions of transistor elements of inverse conductivity type compared to the transistor 160. For convenience, any such transistors are not illustrated in FIG. 1. In the example shown, the transistor 160 may represent an N-channel transistor and, thus, the drain and source regions 162 and the highly doped regions 152 represent N-doped regions. In combination with an N-type doping in the well region 102W, the regions 152 may represent the cathode of the substrate diodes 150. On the other hand, the P-doped regions 153 may form a PN junction 102P with the N-type well region 102W and may, thus, act as anodes of the substrate diodes 150. Moreover, as illustrated, in view of reducing contact resistivity of the circuit elements 160 and 150, metal silicide regions 164 and 151, respectively, may be provided in the highly doped regions 162, 152, 153, for instance in the form of nickel silicide and the like. The cathode side, i.e., the region 152, and the anode side, i.e., the region 153, in each substrate diode 150 are separated by a portion of the well region 102W above which portions of the buried insulating layer 103 and the semiconductor layer 104 are provided, as indicated as 103D, 104D. Depending on the overall process strategy, additional materials, such as a gate dielectric material, an electrode material, such as polysilicon, and the like, may be formed above the portions 104D. It should further be appreciated that, in other cases, the portions 104D may represent an insulating material, i.e., the residues of isolation structures that are typically formed in the semiconductor layer 104 in order to laterally delineate corresponding active regions or semiconductor regions, in and above which are formed circuit elements, such as the transistor 160 and the like. For convenience, any such isolation structures are not shown in FIG. 1. Above the device level, i.e., the semiconductor layer 104 and any circuit elements formed therein and thereabove, such as the transistor 160, and above the substrate diodes 150 within the device area 110A, a contact level 120 is provided, which may be considered as an interface for connecting the circuit elements 160, 150 with a metallization system, of which a very first metallization layer 130 is illustrated, for convenience. The contact level 120 comprises one or more appropriate dielectric materials, such as a layer 121 in combination with a layer 122 provided, for instance, in the form of silicon nitride and silicon dioxide, respectively. Additionally, the contact level 120 comprises contact elements 123A, 123B that connect to the doped semiconductor regions 152, 153 on the one hand and to doped semiconductor regions in the layer 104, such as the drain and source regions 162, on the other hand. The contact elements 123A, 123B are provided in the form of any appropriate conductive material, such as tungsten, aluminum and the like, possibly in combination with appropriate conductive barrier materials, such as titanium nitride, titanium and the like.

The metallization layer 130 comprises any appropriate dielectric material or materials, such as low-k dielectric materials, which are to be understood as dielectric materials having a dielectric constant of 3.0 and less, in combination with any other materials, such as etch stop layers (not shown) and the like. Furthermore, metal lines 133A are provided in the dielectric material 131 so as to connect to the contact elements 123A within the device area 110A, while metal lines 133B connect to the contact elements 123B in the device area 110B. The metal lines 133A, 133B are typically comprised of copper in combination with appropriate conductive barrier materials, such as tantalum, tantalum nitride and the like.

The semiconductor device 100 as illustrate in FIG. 1 may be formed on the basis of the following process strategy. The well region 102W of the crystalline substrate material 102 within the device area 110A may be formed at any appropriate manufacturing stage, i.e., upon forming corresponding active regions in the semiconductor layer 104 by performing masked implantation processes. To this end, a high energy implantation process is performed to implant the well dopant species of the region 102W through the layers 104 and 103 and into the crystalline substrate material 102. In other cases, the substrate window 110A may be formed first by providing an appropriate etch mask so as to etch through the layers 104, 103, thereby exposing portions of the substrate material 102 within the device area 110A, while preserving the portions 104D, 103D. In other cases, a corresponding etch process for exposing portions of the material 102 within the area 110A may be performed after forming corresponding gate electrode structures, such as the gate electrode structure 161 of the transistor 160. Thereafter, any appropriate processes are performed so as to complete the transistor 160, thereby performing appropriate implantation processes for forming the drain and source regions 162 of N-type and P-type transistors, thereby also applying an appropriate masking regime for forming the highly doped regions 152 and 153 of the substrate diodes 150. After any anneal processes for activating dopants and re-crystallizing implantation-induced damage, while also initiating a dopant diffusion, if desired, the metal silicide regions 164, 151 may be commonly formed in the transistor 160 and the substrate diodes 150. Consequently, the circuit elements 160 and 150 may be formed on the basis of substantially the same process sequence, thereby providing a very efficient overall manufacturing flow, while, however, a significant difference in height level between the device area 110A and 110B is generated. The pronounced surface topography caused by this difference in height levels, in turn, may result in significant irregularities in the further processing of the device 100. That is, upon depositing the dielectric material or materials of the contact level, a certain degree of height difference may still exist between the device areas 110A, 110B. That is, typically, the material 121, such as a silicon nitride material, is deposited on the basis of plasma enhanced chemical vapor deposition (CVD) techniques having a more or less conformal deposition behavior. Thereafter, the material 122, for instance in the form of silicon dioxide, is deposited, for instance, by a deposition technique of superior gap filling capability, for instance high density plasma CVD, sub-atmospheric CVD, thereby providing a certain degree of leveling between the areas 110A, 110B, wherein, however, a certain global difference in height level may still exist, even if performing any additional polishing processes for improving the overall surface topography. After providing the dielectric material 122, sophisticated lithography processes are applied in order to form an appropriate etch mask, for instance in the form of a hard mask, a resist mask and the like, which may be used during the subsequent anisotropic etch sequence for etching through the material 122 and finally through the material 121 and into the metal silicide regions 164, 151. Thereafter, the contact openings are filled with the desired conductive material, possibly in combination with a conductive barrier material, and any excess material thereof is removed by chemical mechanical polishing (CMP), wherein process parameters have to be adapted so as to also reliably remove any metal residues in the device area 110A having the reduced global height level. In device generations including transistor elements of approximately 60 nm gate length, a corresponding difference in height level, as indicated by 110H, has been taken into consideration by providing the dielectric material 122 with increased thickness so as to generally take advantage of the non-conformal deposition behavior, possibly in combination with the leveling effect of a CMP process, while the removal of any excess material of the contact elements 123A, 123B has been performed on the basis of process parameters in which a high degree of "dishing" is achieved, i.e., a superior removal of metal compared to the dielectric material 122. In this manner, the excess metal of the contact level may be removed efficiently from within the device area 110A, which, however, may result in a height level difference 110H of approximately 60 nm and even more. Thereafter, the metallization layer 130 is formed by depositing the dielectric material 131 based on any appropriate process strategy, followed by the patterning of the material 131 based on sophisticated lithography techniques. Next, any appropriate conductive barrier material (not shown) is deposited, followed by the deposition of the actual fill material, such as copper and the like. Thereafter, any excess material is removed by appropriate planarization techniques, such as CMP, thereby also requiring the removal of the conductive materials within the device area 110A, which may have a different height level (110D). Consequently, upon reliably removing any metal residues from within the device area 110A, a significant reduction in thickness of the metallization layer 130 in the device area 110B may result, which may, thus, reduce performance of any metal lines 133B provided therein.

Upon further scaling the size of the individual circuit elements, lateral feature sizes and generally the thickness of the metallization layer 130 also has to be adapted. For example, in technologies using a gate length of 40 nm and less, a thickness of the metallization layer 130 may be of a similar order of magnitude as the height differences 110H or 110D, which would, thus, lead to a non-acceptable reduced thickness of the metallization layer 130 in the device area 110B after having reliably removed the excess material in the device area 110A. On the other hand, further increasing the thickness of the dielectric material 122 of the contact level 120 so as to further reduce the height difference 110H may not be a promising option, since significant variations may occur during the complex patterning process for forming the contact elements 123A, 123B due to, for instance, the significant height differences at a generally increased etch depth in the contact level, thereby contributing to significant substrate-to-substrate variations. Consequently, in the conventional approach, typically, a compromise of CMP parameters and thickness of the levels 120 and 130 may be applied, while, however, a significant probability exists that any metal residues may remain in the device area 110A after completing the corresponding polishing process. In this case, leakage paths or short circuits between metal lines 133A may be created, thereby at least reducing performance of the substrate diodes 150 or causing a complete failure of one of these devices. Since reliable temperature data may strongly depend on the diode characteristics, a reduction in the reliability or a degradation of performance of the substrate diodes may contribute to significant yield losses and/or reduced functionality of the semiconductor device 100.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which substrate diodes may be provided with a high degree of compatibility with conventional process strategies, wherein the probability of creating leakage paths and short circuits between individual diodes may be reduced by implementing an additional planarization process upon forming the contact level of the semiconductor device. To this end, the planarizing effect, i.e., the reduction of an existing surface topography, of appropriate materials, such as planarization materials, or appropriate dielectric materials, may be used for performing at least one additional planarization process, thereby providing superior surface planarity upon forming the metallization system of the semiconductor device. In this manner, the difference in height level between device areas having formed therein transistors and a substrate window in an SOI device may be efficiently reduced, thereby avoiding undue material loss in the metallization system. For this purpose, the planarization process, such as a CMP process, an etch process or a combination thereof, may be performed as non-masked processes, thereby avoiding any additional lithography processes as may have been proposed in conventional strategies.

One illustrative method disclosed herein relates to forming an SOI semiconductor device. The method comprises exposing a portion of a crystalline substrate material of the SOI device and forming a plurality of circuit elements in the exposed portion of the crystalline substrate material. The method further comprises forming a transistor in a semiconductor layer of the SOI semiconductor device, wherein the semiconductor layer is formed above the crystalline substrate material and a buried insulating layer. The method additionally comprises forming a dielectric material above the plurality of circuit elements and the transistor and forming a planarization material above the dielectric material. Furthermore, the dielectric material is planarized by using the planarization material. Moreover, the method comprises forming contact elements in the planarized dielectric material so as to connect to the transistor and the plurality of circuit elements.

A further illustrative method disclosed herein relates to forming an SOI semiconductor device. The method comprises exposing a portion of a crystalline substrate material in a first device area of the semiconductor device by removing a semiconductor layer and a buried insulating layer in the first device area. The method further comprises forming a substrate diode in the first device area, wherein the substrate diode comprises a PN junction formed in the portion of the crystalline substrate material. Additionally, a circuit element is formed in the semiconductor layer in a second device area and a first dielectric material is formed above the first and second device areas. The method further comprises performing a polishing process so as to remove a portion of the first dielectric material and forming a second dielectric material above the first dielectric material. Additionally, the method comprises planarizing a surface topography above the first and second device areas in the presence of the first and second dielectric materials.

A still further illustrative method disclosed herein comprises commonly forming drain and source regions of a transistor in a semiconductor layer of a semiconductor device and a PN junction in a portion of a crystalline substrate material, wherein the semiconductor layer is formed on a buried insulating layer that is in turn formed above the crystalline substrate material. The method further comprises forming a dielectric material above the transistor and the portion of the crystalline substrate material. Moreover, a planarization layer is formed on the dielectric material above the transistor and the portion of the crystalline substrate material. The method further comprises reducing a surface topography by performing an etch process so as to remove a portion of the dielectric material and the planarization layer.

BRIEF DESCRIPTION OF THE DRAWINGS

The disclosure may be understood by reference to the following description taken in conjunction with the accompanying drawings, in which like reference numerals identify like elements, and in which.

Figure 1:
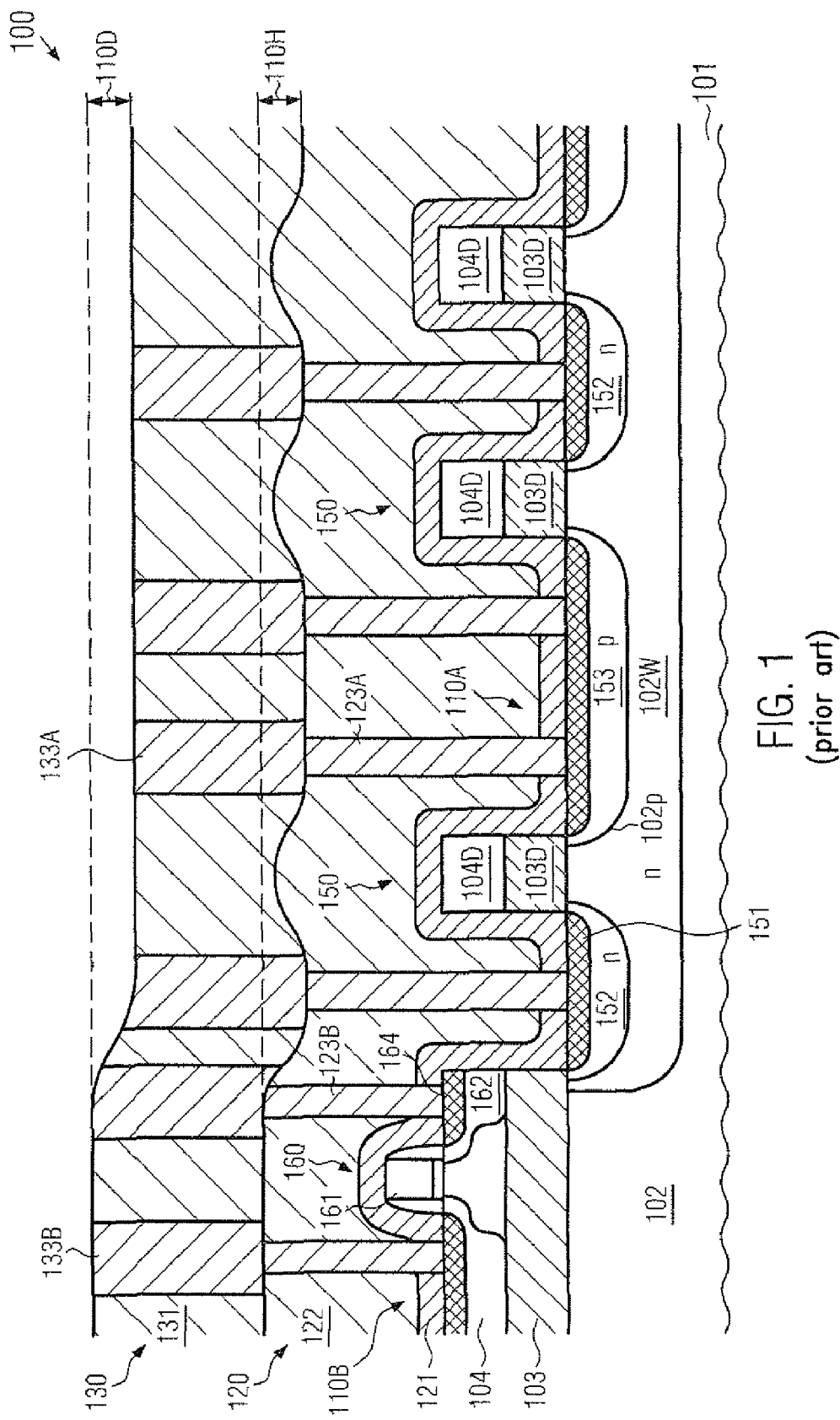
FIG. 1 schematically illustrates a cross-sectional view of an SOI semiconductor device comprising a substrate window having formed therein a plurality of substrate diodes, wherein the pronounced difference in surface topography may result in significant irregularities upon forming a contact level and a metallization layer, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques in which a difference in height level between a device area, in which transistor elements are formed, and a device area or substrate window, in which substrate diodes are formed, may be significantly reduced upon forming the contact level of the SOI semiconductor device, without requiring undue thickness of the dielectric material, which may be accomplished by implementing a planarization process based on an additional dielectric material, such as an organic planarization material and the like, wherein an etch process and/or a polishing process may provide superior surface conditions upon forming the very first metallization layer of the metallization system. In some illustrative embodiments, the superior device topography may be accomplished by providing a planarization material having a similar etch rate as the interlayer dielectric material and performing an etch process, such as a plasma assisted etch process, thereby preferably removing material of the interlayer dielectric material above the device area having the increased height level, and hence efficiently "planarizing" the overall surface topography. In this respect, the term "planarizing" is to be understood as reducing a difference in height level between the substrate window and the device area comprising the transistor elements at least by one third relative to the initial height difference after deposition of the dielectric material. In other illustrative embodiments, in addition to or alternatively to providing an organic planarization material, any other appropriate dielectric material, such as a further layer of the interlayer dielectric material, may be provided after a first polishing process, wherein the superior gap filling capability may result in a reduced surface topography, which may then further be reduced by performing a further polishing process or an etch process, as described above.

In some illustrative embodiments, the additional planarization of a dielectric material may be applied during a replacement gate approach, in which a portion of a gate electrode structure of the transistors may be replaced by a highly conductive electrode metal. In any such replacement gate approaches, typically, a top surface of the gate electrode structure is exposed, for instance by CMP, and subsequently the placeholder material may be replaced by the desired material or materials. To this end, typically, a highly conductive metal, such as aluminum, may be deposited after the removal of the placeholder material and any excess material may be removed by CMP, wherein, also in this case, any unwanted leakage paths in the substrate window above the substrate diodes or any other circuit elements may be substantially avoided due to the superior surface topography upon performing the replacement gate approach.

Consequently, circuit elements formed in and above the crystalline substrate material of an SOI device, such as substrate diodes, may be formed with a high degree of compatibility with conventional process strategies, as for instance described above with reference to FIG. 1, while at the same time the superior surface topography may result in a significant reduction of leakage paths and short circuits without requiring an extra thickness in the contact level and/or the subsequent first metallization layer.

With reference to FIGS. 2a-2h, further illustrative embodiments will now be described in more detail, wherein reference may also be made to FIG. 1, if required.

Figure 2A:
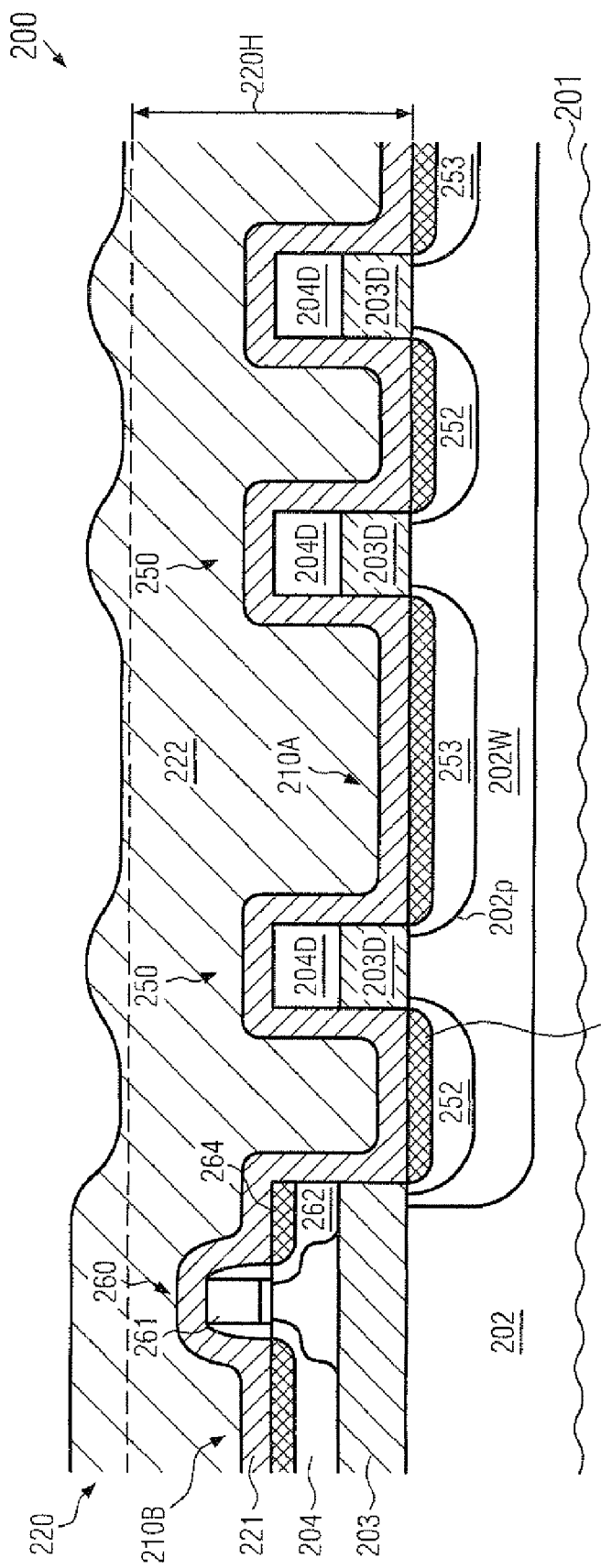
FIGS. 2a-2d schematically illustrate cross-sectional views of a semiconductor device during various manufacturing stages of forming an SOI semiconductor device including substrate diodes, wherein a superior surface topography may be accomplished by providing a planarization material and an etch process upon forming a contact level of the semiconductor device, according to illustrative embodiments.

FIG. 2a schematically illustrates a cross-sectional view of a semiconductor device 200 comprising a substrate 201 in combination with a buried insulating material 203 and a semiconductor layer 204. As previously discussed, the combination of the substrate 201, the insulating layer 203 and the semiconductor layer 204 may be referred to as an SOI device, wherein the SOI configuration may not be provided in some device areas, such as a device area 210A, which may also be referred to as a substrate window, as is also discussed above. On the other hand, a substrate area 210B may be considered as an SOI area, wherein circuit elements, such as a transistor 260, may be formed in and above the semiconductor layer 204. On the other hand, the layers 203 and 204 may be removed, at least partially, in the device area 210A, thereby exposing, at least during certain manufacturing stages, a crystalline substrate material 202 of the substrate 201. The substrate material 202 may comprise an appropriately doped well region 202W, in which highly doped regions 252, 253 of inverse doping may be provided as a part of circuit elements 250, which, in some illustrative embodiments, may represent substrate diodes. In this case, one of the highly doped regions 252, 253, such as the region 253, may form a PN junction 202P with the well region 202W. Furthermore, the dopant concentration and the basic dopant profile of the regions 252, 253 may be similar to the concentration and profile of drain and source regions of transistors formed in the semiconductor layer 204. For example, in the embodiment shown, drain and source regions 262 of the transistor 260 may have a similar configuration as the doped regions 252, while the regions 253 may have a configuration similar to drain and source regions of transistors of inverse conductivity type. Furthermore, metal silicide regions 254 may be formed in the doped regions 252, 253 and metal silicide regions 264 may be formed in the drain and source regions 262.

It should be appreciated that the component described so far may have similar characteristics as is also previously discussed with reference to the semiconductor device 100. In this case, the circuit elements, for instance the substrate diodes 250, may have similar configurations compared to the transistor 260, for instance in terms of dopant concentration, configuration of the metal silicide regions 254, 264 and the like. In other cases, if desired, the circuit elements 250 may have certain differences in configuration, for instance when formed on the basis of at least some different process steps compared to the transistor elements 260, if desired. It should further be appreciated that the semiconductor device 200 may represent a sophisticated device including individual circuit elements, such as the transistor 260, that are formed on the basis of critical dimensions of 100 nm and less and in highly sophisticated applications with 40 nm and less. For example, a gate electrode structure 261 of the transistor 260 may have a gate length in the above-specified range.

The semiconductor device 200 as illustrated in FIG. 2a may be formed on the basis of any appropriate process strategy, for instance by using processes as discussed above with reference to the semiconductor device 100. That is, at any appropriate manufacturing stage, the substrate window 210A may be formed by removing a portion of the layers 203, 204 based on any appropriate masking and etch regime, thereby preserving portions 204D, 203D and, thus, exposing portions of the crystalline substrate material 202 within the device area 210A. Depending on the overall process strategy, at least some components of the circuit elements 250 may be commonly formed with components of the transistor 260, such as the drain and source regions 262 and the doped regions 252.

After completing the basic configuration of the transistor 260 and the circuit element 250, a device level 220 may be formed, which may comprise any appropriate dielectric material or materials, for instance in the form of a dielectric material 221, such as a silicon nitride material, followed by a further dielectric material, which may also be referred to as an interlayer dielectric material 222, for instance in the form of silicon dioxide and the like. The materials 221 and 222 may be formed on the basis of any appropriate deposition technique, as is also previously discussed with reference to the device 100. Upon depositing the material 222, a certain target height level 220H may be determined in advance, which may be selected so as to provide the desired characteristics of the contact level 220 during the further processing of the semiconductor device 200. In the example shown, the height level 220H may be considered as a target height of a corresponding surface of the material 222 above the crystalline substrate material 202, thereby providing a superior global surface topography. Consequently, upon depositing the dielectric material 222, an initial layer thickness is selected such that the target height level 220H may be reached within any recessed device area, such as the substrate window 210A.

Figure 2B:
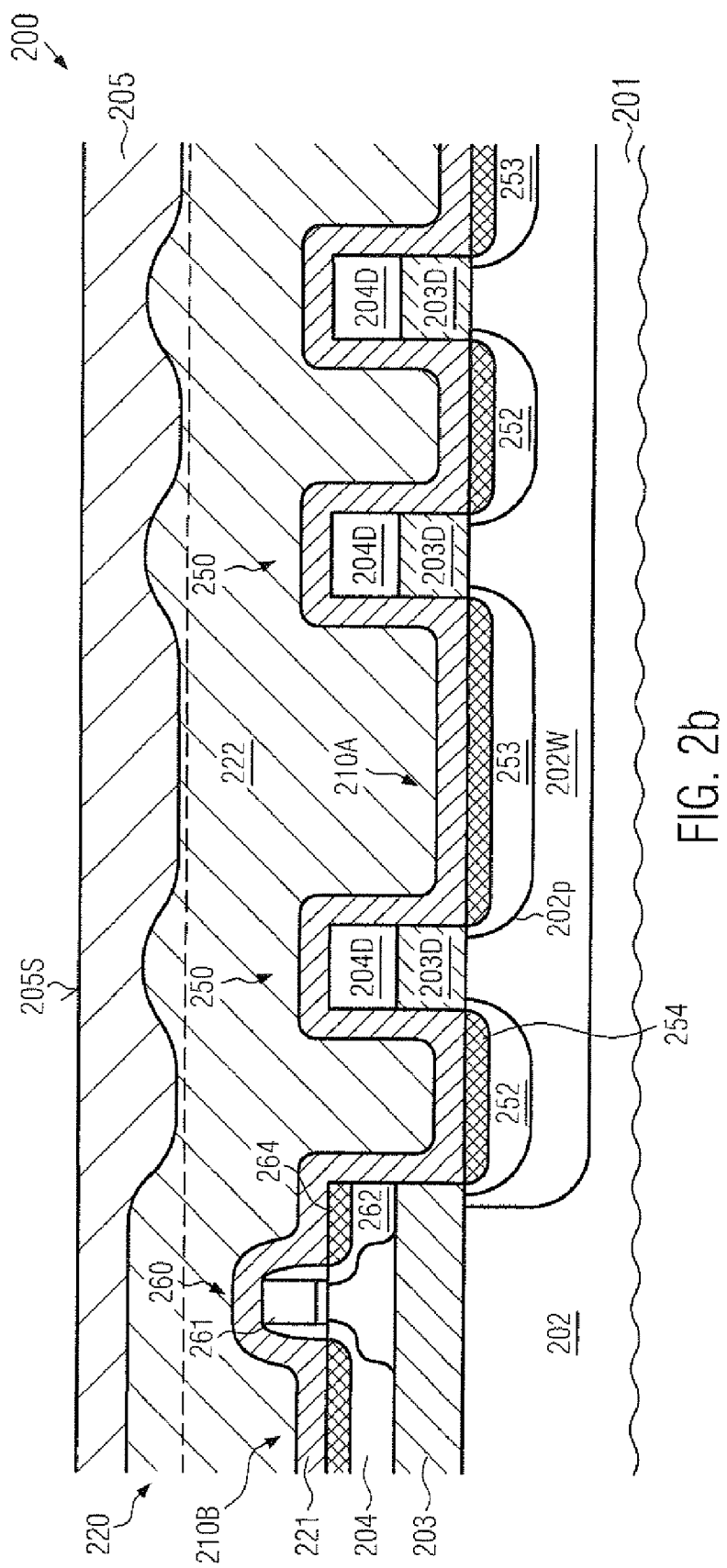

FIG. 2b schematically illustrates the semiconductor device 200 with a planarization material 205 formed on the dielectric material 222. The planarization material 205 may be provided in the form of an organic material, such as polymer material, resist material and the like, which may be applied in a low viscous state, for instance on the basis of spin-on techniques, thereby providing a highly non-conformal deposition behavior. Hence, a substantially planarized surface topography 205S may be obtained upon applying the material 205, thereby providing an increased amount of material above the device area 210A compared to the device area 210B. It should be appreciated that many planarization materials are available and may be used as the planarization material 205, wherein, in some illustrative embodiments, material compositions may be selected that may have a similar etch rate compared to the material 222. To this end, a desired etch recipe may be selected, for instance a plasma assisted etch recipe, and etch rates of various planarization materials may be efficiently determined by experiment and may, thus, be selected so as to comply with the etch rate of the dielectric material 222 in view of the etch recipe under consideration. Furthermore, etch parameters may be adapted to the etch characteristics of the materials 205, 222 in order to obtain a similar etch rate. It should further be appreciated that characteristics of the material 205, such as chemical resistivity and, thus, etch resistivity and the like, may be appropriately adjusted by performing specific treatments, such as radiation treatments, heat treatments and the like, possibly in combination with the incorporation of specific substances, thereby providing a high degree of flexibility in providing the desired chemical behavior of the material 205.

Figure 2C:
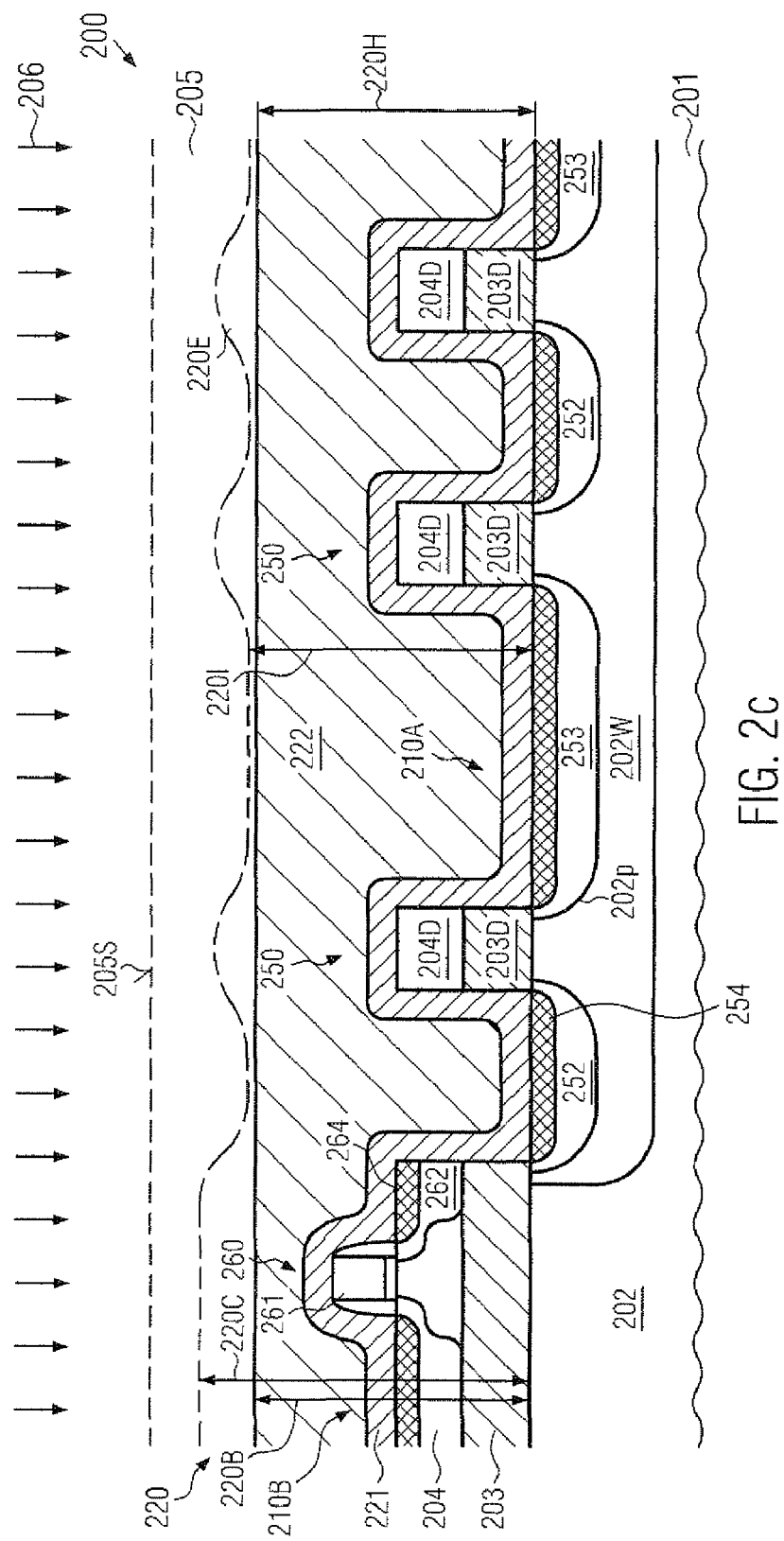

FIG. 2c schematically illustrates the semiconductor device 200 when exposed to an etch ambient 206 in order to remove the material 205 and any excess portion 220E of the dielectric material 222. In some illustrative embodiments, the etch process 206 may be performed as a plasma assisted etch process, thereby providing a highly directional material removal, which may, thus, result in a moderately uniform material removal, even if the etch rates of the materials 205 and 222 may slightly differ from each other. It should be appreciated that a plurality of plasma assisted etch recipes based on fluorine and the like are available for etching silicon dioxide based materials, wherein the removal rate of the material 205 may be adjusted so as to be very similar to the removal rate of the material 222. For instance, the removal rate of the materials 205, 222 may differ by approximately 30% or less, which may be accomplished by selecting appropriate base materials for the material 205 and/or adjusting the characteristics on the basis of additional treatments and/or by adjusting process parameters of the etch process 206, as described above. Consequently, the height level 220H may be obtained in the device area 210A, which may be very similar to a height level 220B obtained in the device area 210B. In some illustrative embodiments, the difference between the height levels 220H, 220B may be less than approximately 65% of a difference of the initial height levels 220I in the area 210A and 220C in the area 210B. It should be appreciated that a further improvement may be accomplished by, for instance, also planarizing the material 205, for instance by a mild polishing process and the like, thereby accomplishing a superior surface topography upon performing the etch process 206. Moreover, the difference between the height levels 220H, 220B may be efficiently reduced by appropriately adapting the etch rates of the materials 205 and 222, as discussed above.

Consequently, the further processing may be continued on the basis of superior process conditions for forming contact elements in the contact level 220 and providing a metallization system.

Figure 2D:
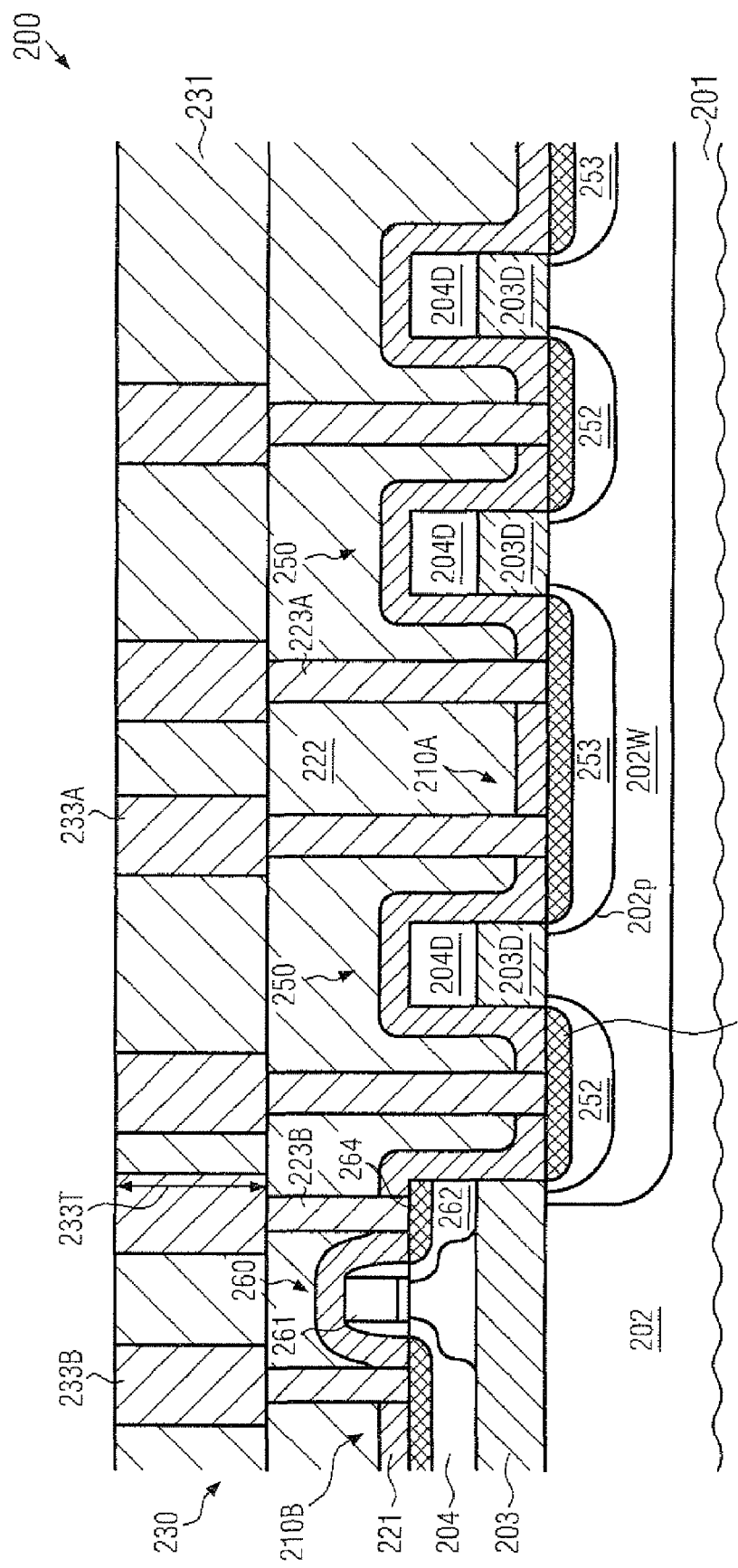

FIG. 2d schematically illustrates the semiconductor device 200 in a further advanced manufacturing stage. As illustrated, contact elements, 223A may be provided in the dielectric material 222 and the dielectric material 221 so as to connect to the circuit elements 250, i.e., to the metal silicide regions 254 formed in the crystalline substrate material 202 within the device area 210A. Similarly, a contact element 223B may be provided in the device area 210B so as to connect to the metal silicide region 264. The contact elements 223A, 223B may be formed on the basis of any appropriate manufacturing strategy, wherein, due to the superior surface topography of the dielectric material 222, any complex processes, such as lithography, patterning corresponding openings and refilling the same with a conductive material, may be accomplished on the basis of superior process uniformity. For instance, the thickness of the material 222 may not have to be selected with respect to reducing overall surface topography, as may be the case in conventional strategies, thereby providing a layer thickness that is appropriate for passivating the circuit elements 260, 250. Consequently, in particular, the complex patterning of contact openings may be completed with superior uniformity. Similarly, the deposition may be enhanced and, in particular, the removal of any excess material by CMP may be accomplished with superior efficiency and uniformity.

Furthermore, in the manufacturing stage shown in FIG. 2d, a metallization layer 230 comprises an appropriate dielectric material 231 or a plurality of dielectric materials in combination with metal lines 233A connecting to the contact elements 223A and metal lines 233B connecting to the contact elements 223B. Basically, the metallization layer 230 may have a configuration as is also described above with reference to the semiconductor device 100, wherein, however, a superior overall surface topography may be obtained, while, at the same time, a desired thickness of the material 231 and, thus, of the metal lines 233A, 233B may be implemented. That is, due to the superior surface topography, an initial thickness of the metallization layer 230 may be implemented, which may be selected in accordance with design requirements, rather than requiring an additional extra thickness in order to take into consideration the pronounced surface topography as may be encountered in conventional strategies. Consequently, a thickness or height 233T of the metal lines 233A, 233B may be approximately 150 nm or less in sophisticated applications. The metallization layer 230 may be formed on the basis of process techniques as discussed above, wherein, in particular during the final planarization process for removing any excess metal, such as copper, conductive barrier materials and the like, metal residues may also be efficiently removed between the metal lines 233A in the device area 210A, without unduly reducing a desired thickness of the metal line 233B. Consequently, the probability of creating leakage paths between the metal lines 233A in the device area 210A may be reduced compared to conventional strategies.

Figure 2E:
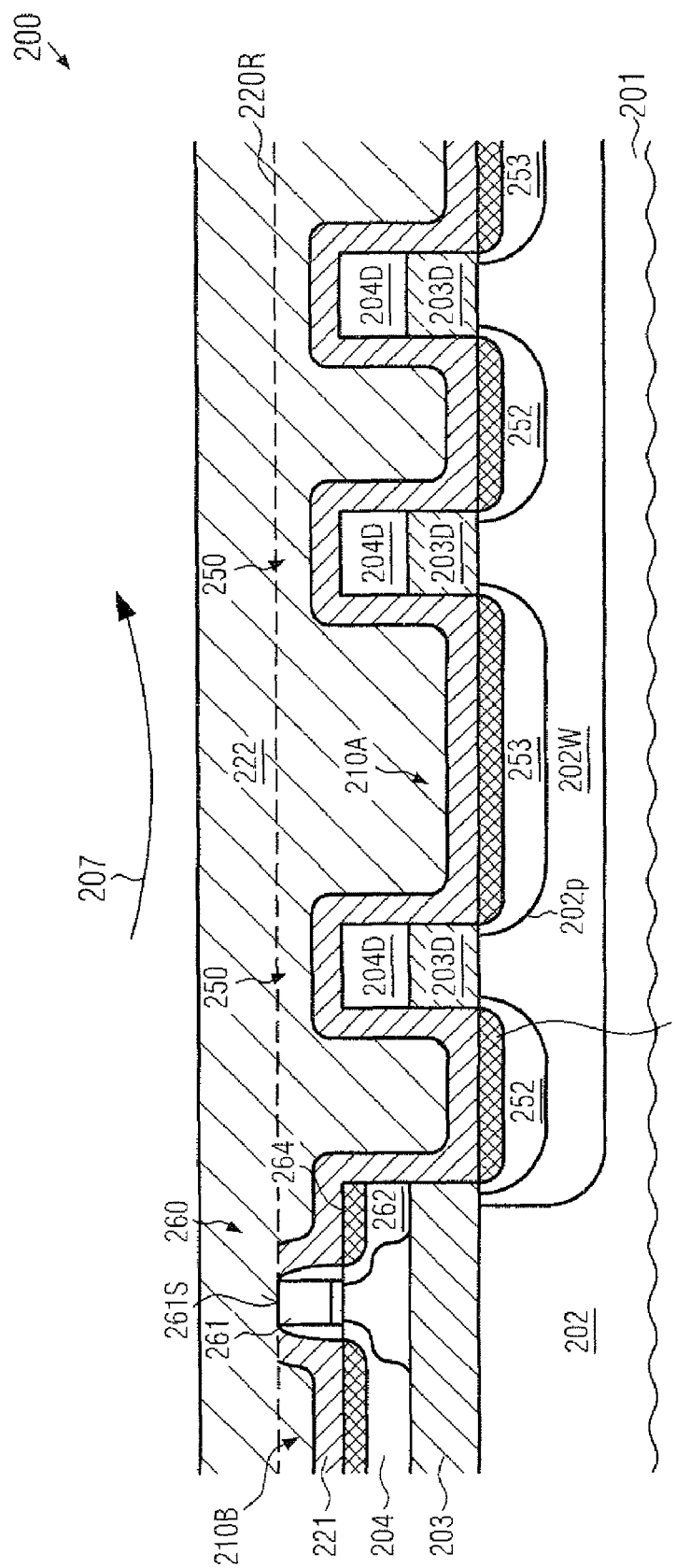
FIGS. 2e-2f schematically illustrate cross-sectional views of the semiconductor device according to further illustrative embodiments, in which the surface topography of an interlayer dielectric material of the contact level may be used during a replacement gate approach in sophisticated SOI devices.

FIG. 2e schematically illustrates the semiconductor device 200 in a manufacturing stage in which the dielectric material 222 is provided with superior surface topography, which may be accomplished, for instance, on the basis of process techniques as described above. Moreover, in the embodiment shown, prior to forming any contact elements, a portion of the material 222 is to be removed, possibly in combination with a portion of the material 221, in order to expose a surface 261S of the gate electrode structure 261. For this purpose, a CMP process 207 may be performed, in which a finally obtained height level 220R, as required for exposing the surface 261S, may result in an even superior overall surface topography due to a certain degree of planarizing effect of the process 207. After exposing the surface 261S, any appropriate process sequence may be performed so as to replace one or more materials of the gate electrode structure 261, in accordance with sophisticated replacement gate approaches. For example, the gate electrode structure 261 may comprise a gate dielectric layer (not shown) including a high-k dielectric material, or a placeholder material, such as a polysilicon material and the like, may be efficiently removed on the basis of the exposed surface 261S. Thereafter, appropriate metal materials, for instance for adjusting a work function and providing a highly conductive electrode material, may be filled into the resulting opening, thereby providing a high-k metal gate electrode structure for the transistor 260. In other cases, additionally, a high-k dielectric material may be filled into the gate electrode structure 261 after removing a portion thereof.

Figure 2F:
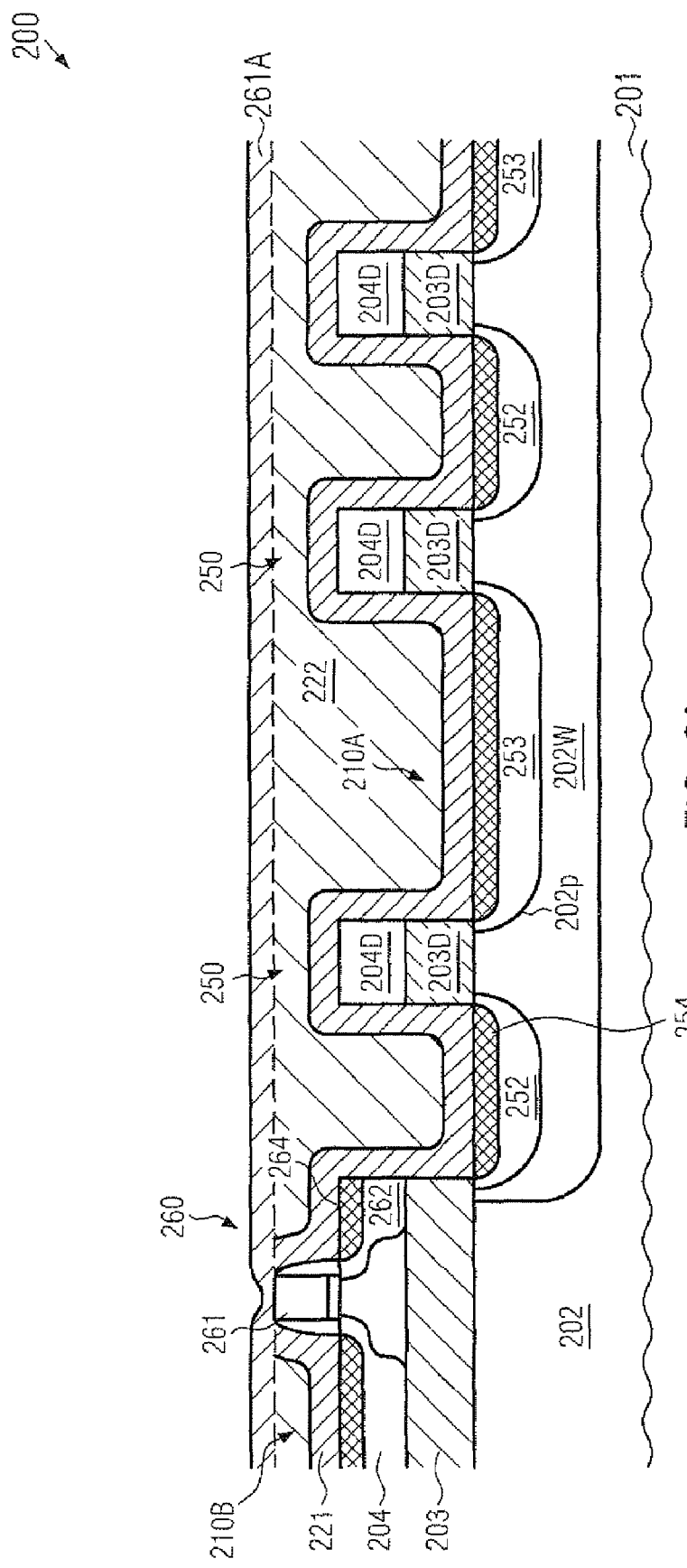

FIG. 2f schematically illustrates the device 200 with a layer of conductive material 261A, for instance in the form of aluminum, possibly in combination with other conductive materials, such as titanium nitride, tantalum, tantalum nitride and the like, formed within the gate electrode structure 261 and on the dielectric material 222. Any excess material of the layer 261A may then be removed on the basis of, for instance, a CMP process, wherein the enhanced surface topography may result in a reliable removal of the conductive material in the device area 210A, thereby avoiding the creation of any leakage paths, which may be created upon completing a contact level of the semiconductor device 200, for instance by forming contact elements, which may extend through the material 222, and which would cause leakage currents in the presence of any material residues of the layer 261A. Consequently, sophisticated replacement gate approaches may be applied, since a reliable and efficient removal of the materials 261A within the device area 210A may be accomplished on the basis of the superior surface topography.

Figure 2G:
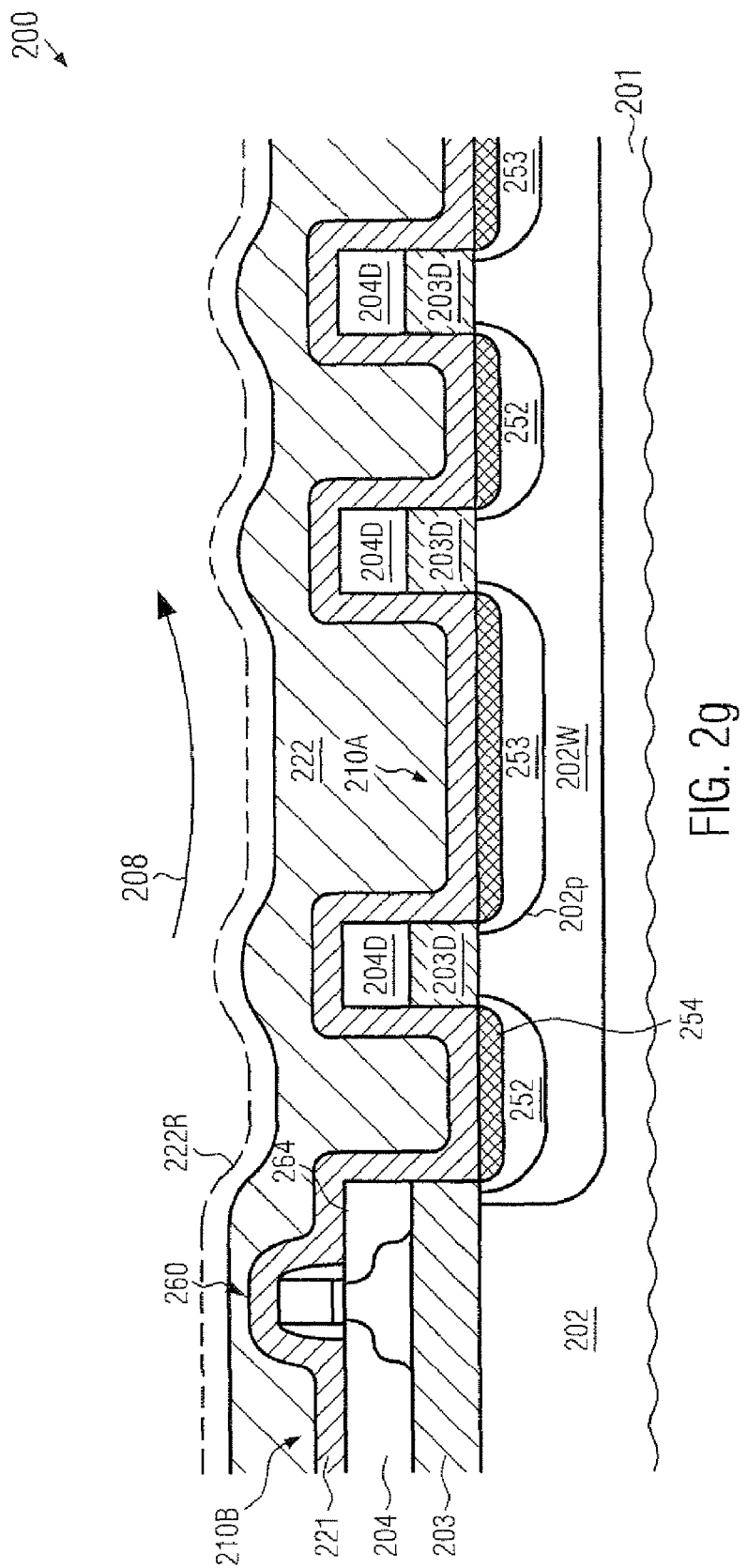
FIGS. 2g-2h schematically illustrate cross-sectional views of the semiconductor device according to still further illustrative embodiments, in which at least one deposition and removal cycle may be applied to an interlayer dielectric material, possibly in combination with a planarization material, so as to enhance the overall surface topography.

FIG. 2g schematically illustrates the semiconductor device 200 according to further illustrative embodiments in which the dielectric material 222 may be provided with a thickness so as to reliably fill the substrate window 210A, as indicated by the dashed line 222R. Thereafter, a polishing process 208 may be applied so as to remove a portion of the dielectric material 222, thereby obtaining a certain degree of leveling between the height levels in the areas 210B and 210A. That is, upon performing the polishing process 208, if desired, the dielectric material 221 may be used as an efficient stop material so that with increasing process time of the process 208 the stop effect is increased and, thus, the resulting removal of the material 222 may be reduced in the area 210A, while nevertheless efficiently removing material in the device area 210B. In this manner, the initial height level may be reduced to a certain degree.

Figure 2H:
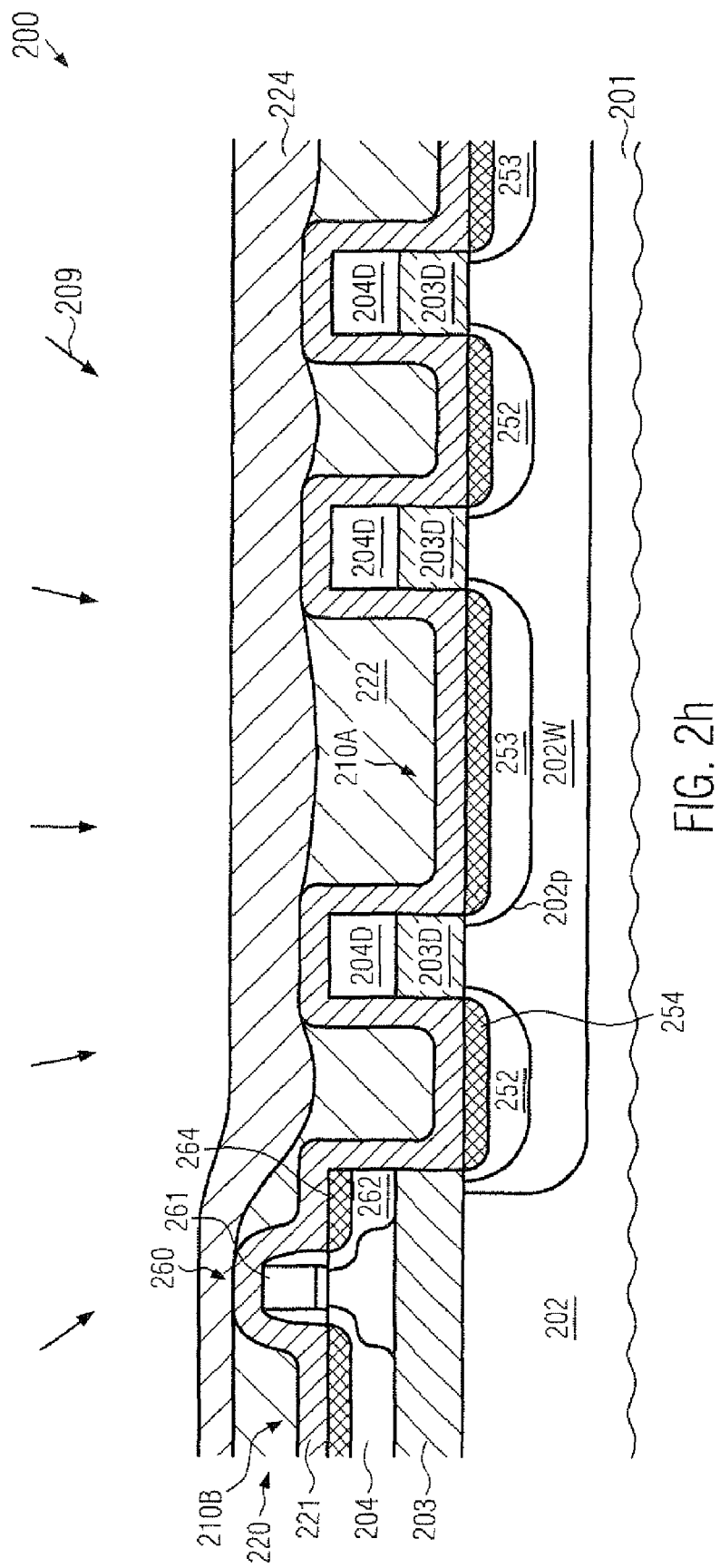

FIG. 2h schematically illustrates the semiconductor device 200 in a further advanced manufacturing stage in which a further dielectric material 224 may be deposited during a deposition process 209, which may have more or less pronounced non-conformal deposition behavior, thereby even further reducing the surface topography. In one illustrative embodiment, the material 224 may be provided in the form of an interlayer dielectric material, such as a silicon dioxide material, which may be deposited in a similar manner as the dielectric material 222. Thereafter, a further polishing process, for instance based on process parameters as may also be used in the polishing process 208 (FIG. 2g), may be applied so as to further reduce the surface topography and to obtain, in some illustrative embodiments, the desired target thickness, and, thus, height level of the contact level 220. In other illustrative embodiments, after further planarizing the material 224 by a polishing process, a planarization material may be applied so as to further enhance the surface topography and the planarization material may be etched, as is previously explained.

In other illustrative embodiments, after depositing the material 224, a further CMP process may be performed so as to further planarize the overall surface topography, while at the same time finally exposing a surface of the gate electrode 261, as is for instance also illustrated in FIG. 2f. Consequently, in this case a replacement gate approach may be applied on the basis of a superior surface topography obtained by two or more polishing processes with an intermediate deposition of the dielectric material, such as the dielectric material 224.

As a result, the present disclosure provides manufacturing techniques in which the pronounced surface topography caused by substrate windows in SOI devices may be reduced upon forming a contact level of the semiconductor device by performing additional planarization processes based on an additionally applied dielectric material, such as a planarization material and the like. The planarization process may comprise an appropriately designed etch process and/or a CMP process. Thus, in sophisticated applications, the contact level may be provided without additional leakage paths, for instance when applying a replacement gate approach, and also any metal residues of the first metallization layer may be efficiently removed within the substrate window area without unduly reducing the thickness of the metallization layer above transistor areas.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an SOI semiconductor device, the method comprising:
   exposing a portion of a crystalline substrate material of said SOI device;
   forming a plurality of circuit elements in said exposed portion of the crystalline substrate material;
   forming a transistor in a semiconductor layer of said SOI semiconductor device, said semiconductor layer being formed above said crystalline substrate material and a buried insulating layer;
   forming a dielectric material above said plurality of circuit elements and said transistor;
   forming a planarization material above said dielectric material;
   planarizing said dielectric material by removing at least a portion of said planarization material and at least a portion of said dielectric material in a common planarization process; and
   forming contact elements in said planarized dielectric material so as to connect to said transistor and said plurality of circuit elements.

2. The method of claim 1, wherein planarizing said dielectric material comprises performing an etch process.

3. The method of claim 2, wherein performing an etch process comprises performing a plasma assisted etch process.

4. The method of claim 1, wherein forming said plurality of circuit elements comprises forming one or more PN junctions of a substrate diode in said portion of said crystalline substrate material.

5. The method of claim 1, further comprising forming a metallization layer above said planarized dielectric material, wherein said metallization layer has a thickness of approximately 150 nm or less.

6. The method of claim 1, further comprising exposing a top surface of a gate electrode structure of said transistor after planarizing said dielectric material.

7. The method of claim 6, further comprising replacing at least a portion of said gate electrode structure with a metal-containing electrode material.

8. The method of claim 6, wherein said gate electrode structure is formed on the basis of a target gate length of 40 nm or less.

9. The method of claim 7, further comprising forming a second dielectric material above said planarized dielectric material and above said gate electrode structure comprising said metal-containing electrode material and forming said contact elements in said dielectric material and said second dielectric material.

10. A method of forming an SOI semiconductor device, said method comprising:
exposing a portion of a crystalline substrate material in a first device area of said semiconductor device by removing a semiconductor layer and a buried insulating layer in said first device area;
forming a substrate diode in said first device area, said substrate diode comprising a PN junction formed in said portion of said crystalline substrate material;
forming a circuit element in said semiconductor layer in a second device area;
forming a first dielectric material above said first and second device areas;
performing a polishing process so as to remove a portion of said first dielectric material;
forming a second dielectric material above said first dielectric material; and
planarizing a surface topography above said first and second device areas by removing at least a portion of said first and second dielectric materials in a common planarization process.

11. The method of claim 10, wherein planarizing said surface topography comprises performing an etch process.

12. The method of claim 11, wherein forming said second dielectric material comprises forming a planarization material above said first dielectric material.

13. The method of claim 10, wherein planarizing said surface topography comprises performing a second polishing process.

14. The method of claim 13, further comprising forming a third dielectric material above said first and second device areas after said second polishing process and performing a third polishing process.

15. The method of claim 10, wherein performing a polishing process so as to remove a portion of said first dielectric material comprises exposing a top surface of a gate electrode structure of said circuit element.

16. The method of claim 15, further comprising replacing a portion of said gate electrode structure by a conductive electrode material after planarizing said surface topography.

17. The method of claim 10, further comprising forming contact elements at least in said first dielectric material so as to connect to said PN junction and said circuit element, respectively.

18. The method of claim 17, further comprising forming a metallization layer above said contact elements, wherein said metallization layer comprises metal lines having a thickness of approximately 150 nm or less.

19. A method, comprising:
commonly forming drain and source regions of a transistor in a semiconductor layer of a semiconductor device and a PN junction in a portion of a crystalline substrate material, said semiconductor layer being formed on a buried insulating layer that is formed above said crystalline substrate material;
forming a dielectric material above said transistor and said portion of said crystalline substrate material;
forming a planarization layer on said dielectric material above said transistor and said portion; and
reducing a surface topography by performing an etch process so as to remove a portion of said dielectric material and said planarization layer.

20. The method of claim 19, further comprising forming a metallization layer above said dielectric material having said reduced surface topography, wherein said metallization layer comprises metal lines having a thickness of approximately 150 nm or less.

21. The method of claim 19, wherein said portion of said dielectric material and said planarization layer are removed in a common etch process.

* * * * *